(12) United States Patent
Taga et al.

(10) Patent No.: US 12,040,536 B2
(45) Date of Patent: Jul. 16, 2024

(54) ELECTRONIC DEVICE

(71) Applicant: Japan Display Inc., Tokyo (JP)

(72) Inventors: Hiroki Taga, Tokyo (JP); Yoko Fukunaga, Tokyo (JP); Nobuhiro Hosokawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 406 days.

(21) Appl. No.: 17/304,330

(22) Filed: Jun. 18, 2021

(65) Prior Publication Data

US 2021/0313670 A1 Oct. 7, 2021

Related U.S. Application Data

(63) Continuation of application No. PCT/JP2019/038660, filed on Sep. 30, 2019.

(30) Foreign Application Priority Data

Dec. 19, 2018 (JP) ................. 2018-237597

(51) Int. Cl.
*H01Q 7/00* (2006.01)
*H01Q 1/27* (2006.01)
*H05K 5/00* (2006.01)

(52) U.S. Cl.
CPC ............ *H01Q 1/273* (2013.01); *H01Q 7/00* (2013.01); *H05K 5/0017* (2013.01)

(58) Field of Classification Search
None
See application file for complete search history.

(56) References Cited

U.S. PATENT DOCUMENTS

| 10,333,200 | B2 * | 6/2019 | Moon | H01Q 1/273 |
| 11,145,951 | B2 * | 10/2021 | Ko | H01Q 1/273 |
| 2009/0046020 | A1 * | 2/2009 | Kato | H01Q 1/273 343/702 |
| 2010/0321325 | A1 * | 12/2010 | Springer | H01Q 1/2266 345/173 |
| 2015/0381239 | A1 * | 12/2015 | Shostak | H01Q 1/243 343/720 |

FOREIGN PATENT DOCUMENTS

| CN | 103676638 A | * 3/2014 | ............ G04R 60/10 |
| JP | 2002-098777 A | 4/2002 | |
| JP | 2003143030 A | * 5/2003 | |

(Continued)

OTHER PUBLICATIONS

Combined Chinese Office Action and Search Report issued Jan. 14, 2022 in Chinese Patent Application No. 201980083587.8 (submitting unedited computer generated English translation provided by Global Dossier only), 7 pages.

(Continued)

*Primary Examiner* — Ab Salam Alkassim, Jr.
*Assistant Examiner* — Ahn N Ho
(74) *Attorney, Agent, or Firm* — Maier & Maier, PLLC

(57) ABSTRACT

According to one embodiment, an electronic device includes a display panel, an antenna wiring substrate opposed to the display panel and including an antenna wiring line forming an antenna and a signal wiring line provided on the antenna wiring substrate and supplying a drive signal to the display panel.

8 Claims, 13 Drawing Sheets

(56) References Cited

FOREIGN PATENT DOCUMENTS

| JP | 2003143030 A |   | 5/2003 |
|----|--------------|---|--------|
| JP | 2015-121544 A |   | 7/2015 |
| JP | 2017-083229 A |   | 5/2017 |
| JP | 2017083229 A | * | 5/2017 |
| KR | 20160135493 A | * | 11/2016 |
| TW | M336556 U |   | 7/2008 |
| WO | 8907347 A1 |   | 8/1989 |

OTHER PUBLICATIONS

International Search Report issued Nov. 5, 2019 in PCT/JP2019/038660 filed on Sep. 30, 2019, citing documents AQ therein, 1 page.
Office Action issued on Dec. 13, 2022, in corresponding Japanese Application No. 2018-237597, 6 pages.
Office Action issued on Aug. 23, 2022, in corresponding Chinese Application No. 2019800835878, 11 pages.
Office Action issued on Sep. 13, 2022, in corresponding Japanese Application No. 2018237597, 6 pages.

\* cited by examiner

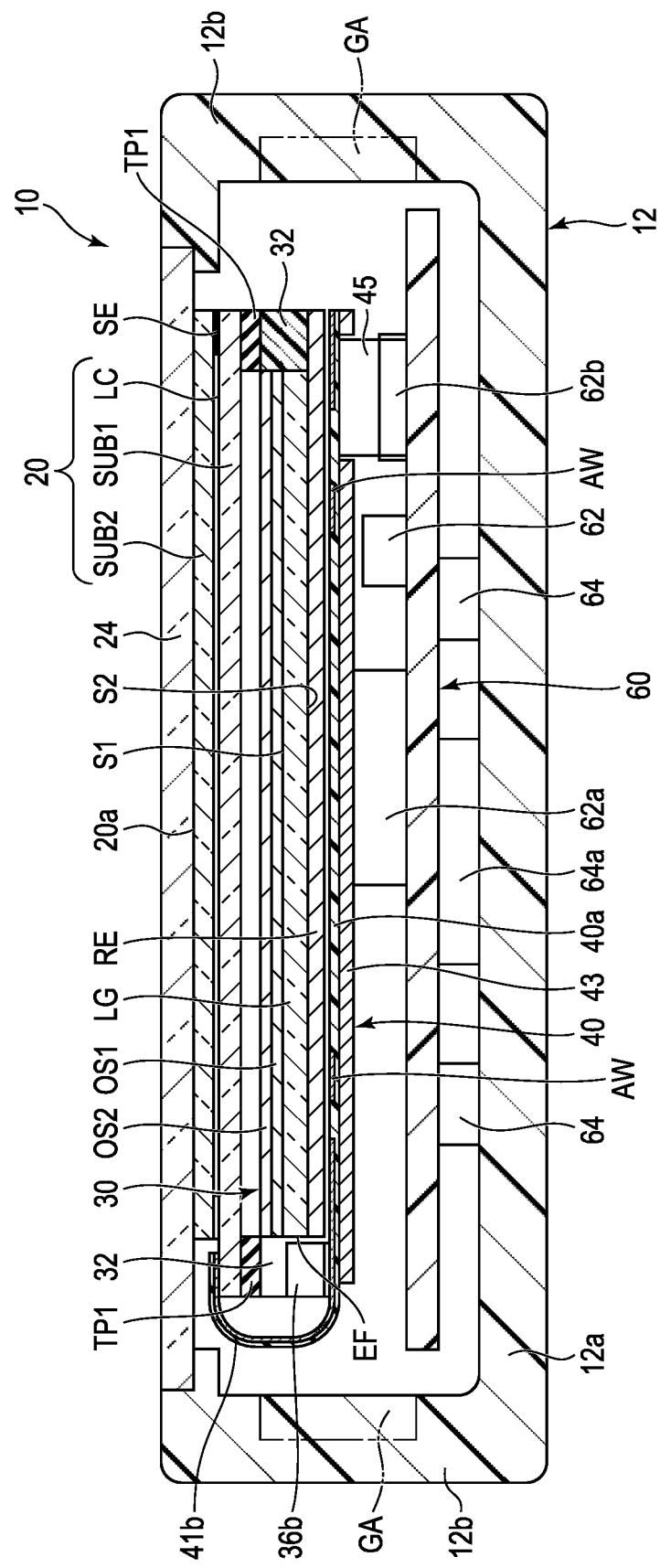
F I G. 10

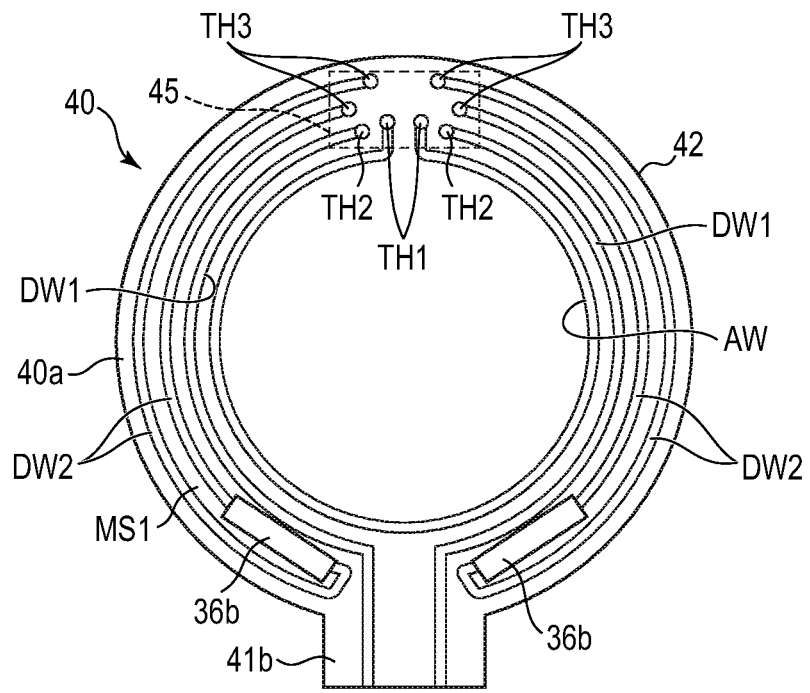
F I G. 11
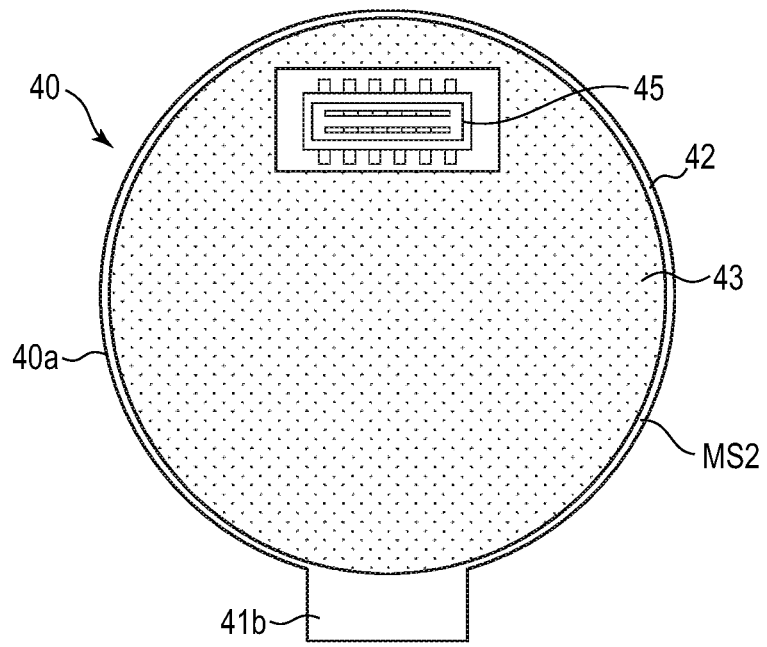
F I G. 12

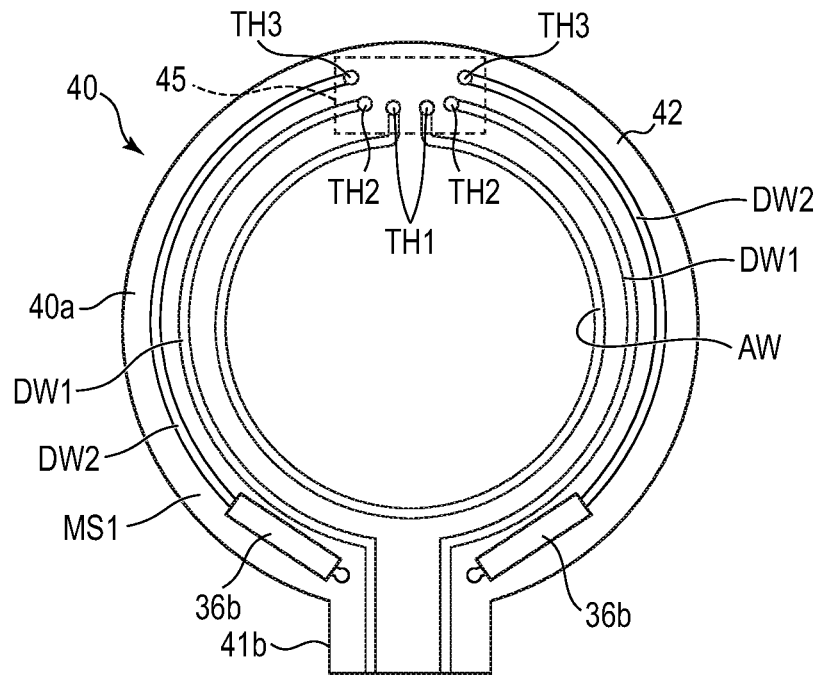
F I G. 13
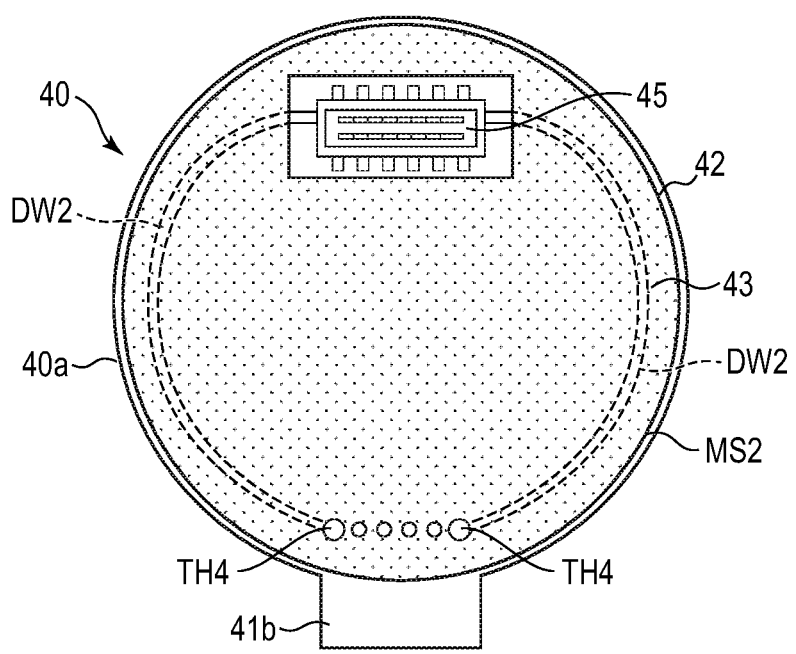
F I G. 14

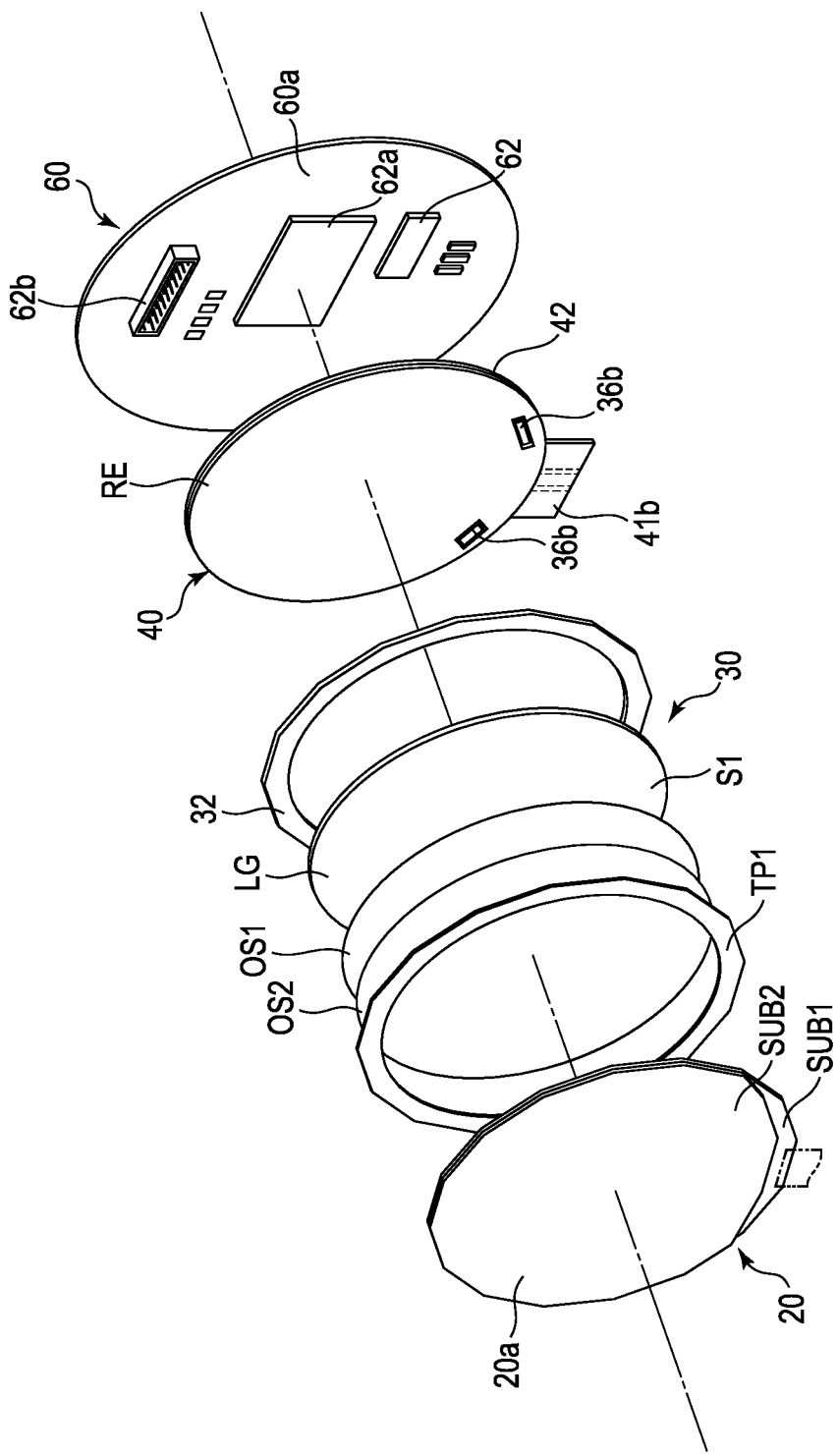
F I G. 15

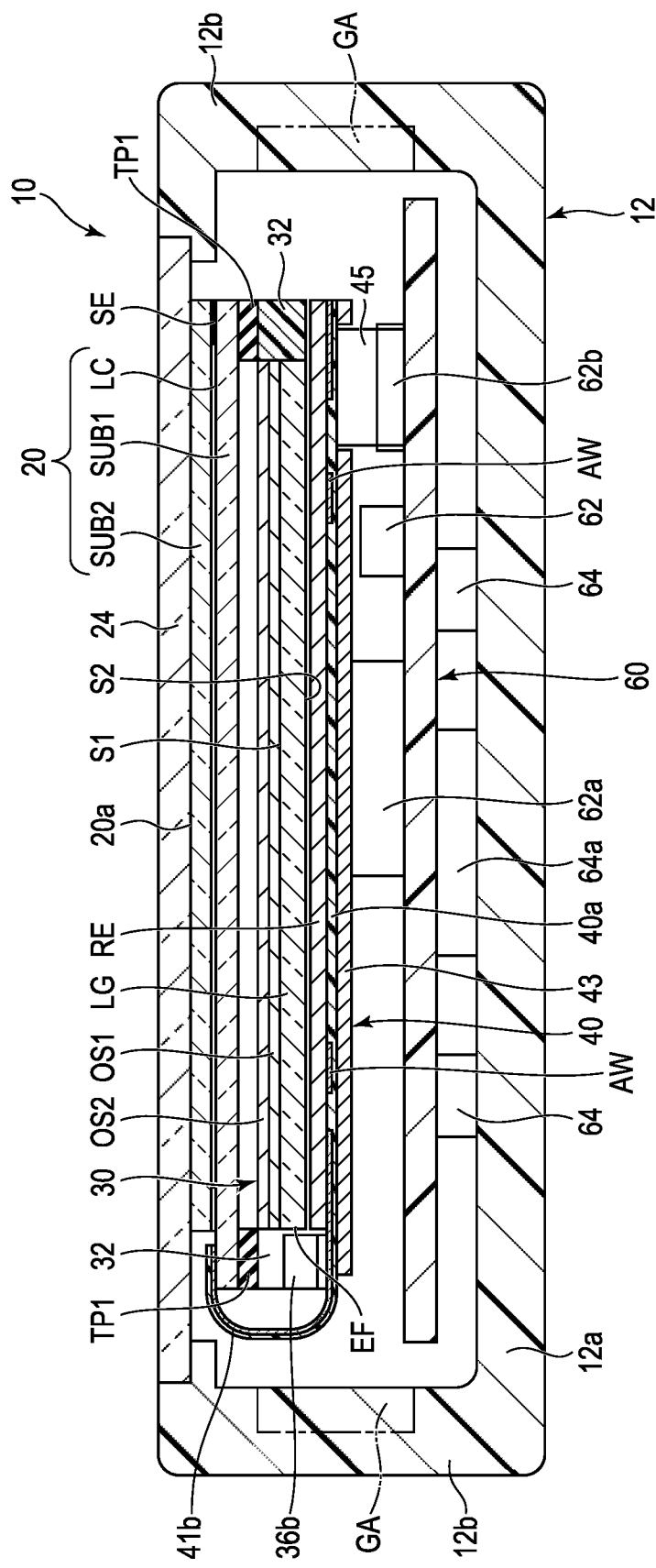
F I G. 16

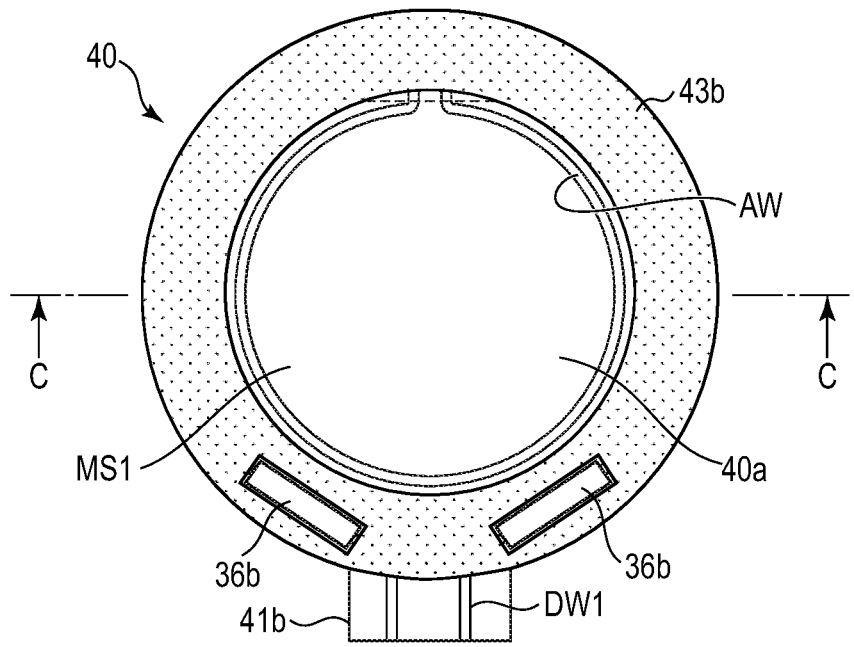
F I G. 17
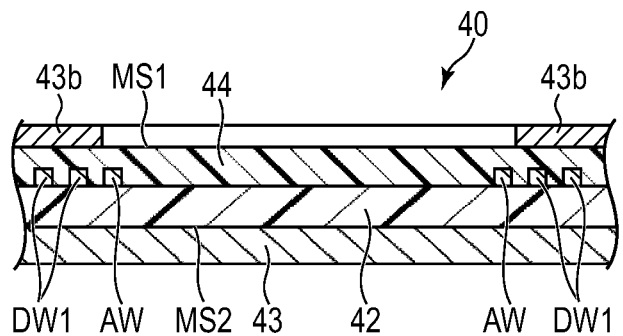
F I G. 18

ELECTRONIC DEVICE

CROSS-REFERENCE TO RELATED APPLICATIONS

This application is a Continuation Application of PCT Application No. PCT/JP2019/038660, filed Sep. 30, 2019 and based upon and claiming the benefit of priority from Japanese Patent Application No. 2018-237597, filed Dec. 19, 2018, the entire contents of all of which are incorporated herein by reference.

FIELD

Embodiments described herein relate generally to an electronic device comprising an antenna wiring substrate.

BACKGROUND

In recent years, a number of mobile electronic devices such as smartphones and wearable electronic devices that can be mounted on the body have been provided. These mobile electronic devices and wearable electronic devices are usually provided with a wireless antenna capable of wireless communication, a display panel (liquid crystal display panel, organic EL display panel), a printed circuit board, and the like.

Many electronic circuits and electronic components generate noise of a long wavelength band, and noise from adjacent wiring and electronic components is easily mixed in when receiving standard radio waves. Further, for example, in a small wearable electronic device such as a wrist watch, a wireless antenna, wiring lines of a display panel, wiring lines of a backlight device and other electronic parts are densely arranged in a housing or a case. Therefore, the problem of noise mixing is significant. For example, noise is likely to occur due to coupling between wiring lines, and noise is likely to be mixed into wiring lines from electronic components.

BRIEF DESCRIPTION OF THE DRAWINGS

FIG. 10 is a cross-sectional view of the wearable device according to the second embodiment.

FIG. 11 is a plan view showing a wiring line side of an antenna wiring substrate.

FIG. 12 is a plan view showing a rear surface side of the antenna wiring substrate.

FIG. 13 is a plan view showing a wiring line side of an antenna wiring substrate according to the third modified example.

FIG. 14 is a plan view showing a rear surface side of the antenna wiring substrate according to the third modified example.

FIG. 15 is an exploded perspective view showing structural components of a wearable device according to the third embodiment.

FIG. 16 is a cross-sectional view of the wearable device according to the third embodiment.

FIG. 17 is a plan view showing a wiring line side of the antenna wiring substrate according to the fourth modified example.

FIG. 18 is a cross-sectional view of the antenna wiring substrate taken along line C-C of FIG. 17.

DETAILED DESCRIPTION

Figure 1:
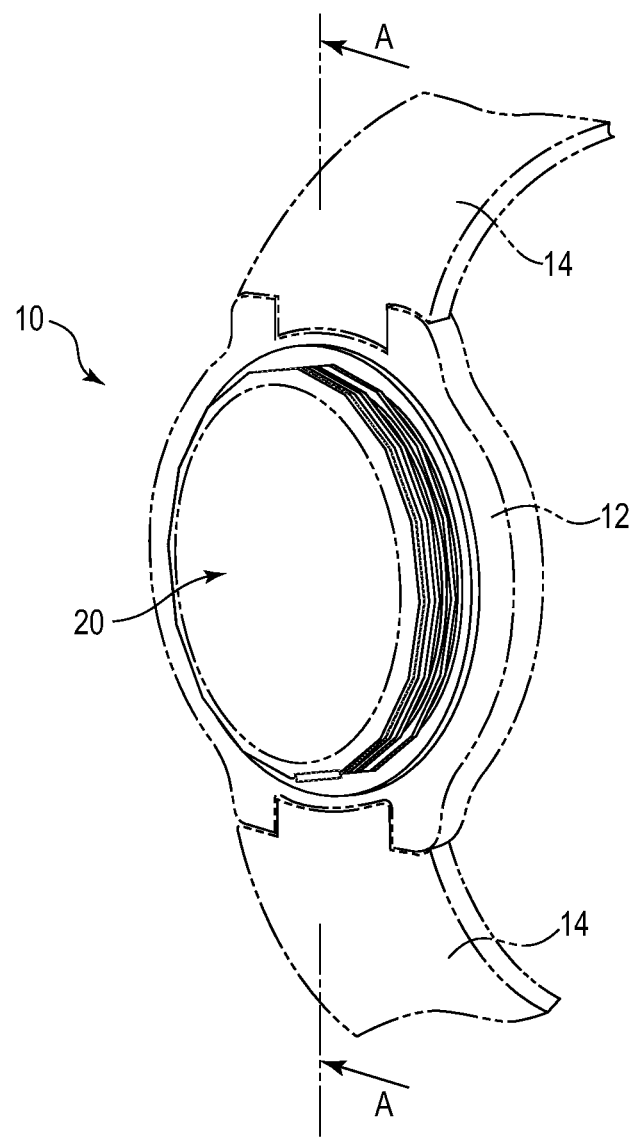
FIG. 1 is a perspective view schematically showing a wearable device according to the first embodiment.

Various embodiments will be described hereinafter with reference to the accompanying drawings. In general, according to one embodiment, an electronic device comprises a display panel, an antenna wiring substrate opposed to the display panel and comprising an antenna wiring line forming an antenna and a signal wiring line provided on the antenna wiring substrate and supplying a drive signal to the display panel.

It should be noted that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Further, in the present specification and the drawings, components having the same or similar functions as those described above with respect to the already-existing drawings are designated by the same reference numerals, and redundant description may be omitted.

First Embodiment

FIG. 1 is a perspective view schematically showing a wrist-watch-type wearable device according to an embodiment. The first embodiment illustrates a wearable device 10 applied to a wrist watch type. As shown, the wearable device 10 comprises a flat circular, elliptical or polygonal housing 12. In the housing 12, a control circuit board, an antenna wiring substrate, a backlight device, a display panel 20 and the like, which will be described later, are accommodated in a stacked state. A band 14 is attached to the housing 12.

Figure 2:
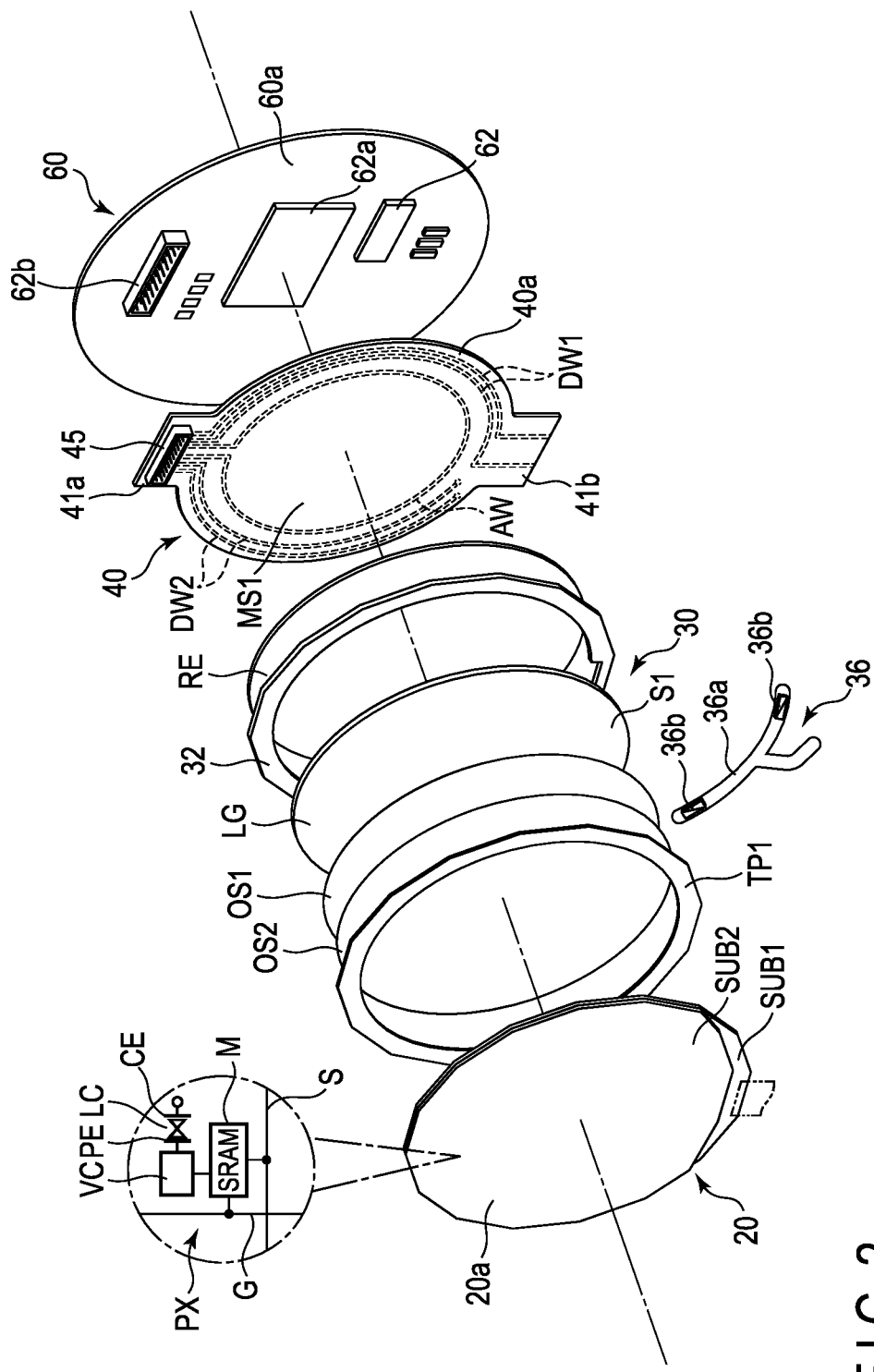
FIG. 2 is an exploded perspective view showing components arranged in a housing of a wearable device.
Figure 3:
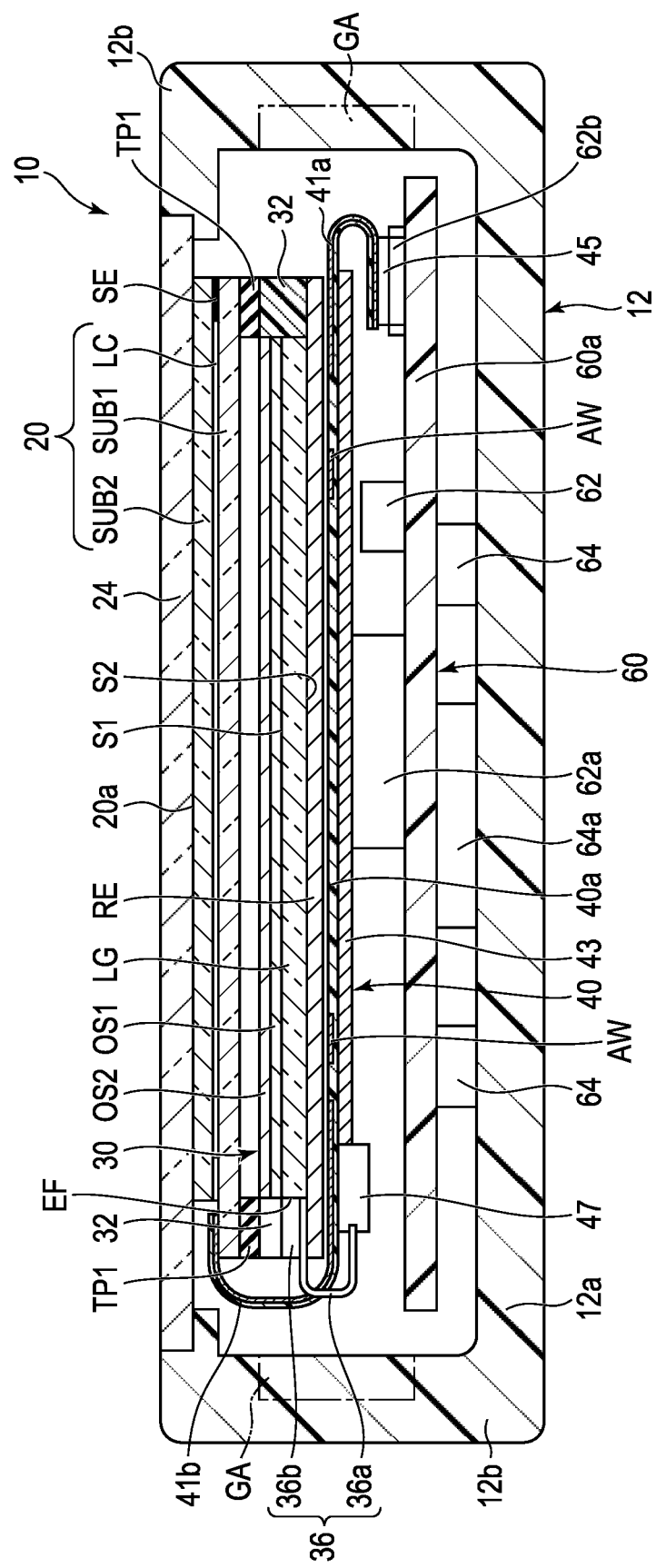
FIG. 3 is a cross-sectional view of the wearable device taken along line A-A in FIG. 1.

FIG. 2 is an exploded perspective view showing structural components arranged in the housing 12, and FIG. 3 is a sectional view of the wearable device 10 taken along line A-A in FIG. 1.

As shown in FIG. 2, the wearable device 10 comprises a display panel 20, a backlight device 30, an antenna wiring substrate 40 and a control circuit board 60, and these structural components are formed into a substantially circular shape, an elliptical shape or a polygonal shape to correspond to the shape of the housing 12.

For example, a liquid crystal display panel is used as the display panel 20. As shown in FIGS. 2 and 3, the display panel 20 comprises a polygonal first substrate SUB1, a polygonal second substrate SUB2 dispose to oppose the first substrate SUB1, and a liquid crystal layer LC sealed between the first substrate SUB1 and the second substrate SUB2. A circumferential edge portion of the second substrate SUB2 is attached to the first substrate SUB1 with a sealing material SE. A polarizer (not shown) is attached to a surface of the second substrate SUB2 to form a display surface 20a of the display panel 20. A polarizer is attached to a surface of the first substrate SUB1(, which is a rear surface of the display panel 20). As the first substrate SUB1 and the second substrate SUB2, flexible substrates formed of glass or synthetic resin sheets are used.

As schematically shown in FIG. 2, the display panel 20 comprises a plurality of pixels PX arranged in a matrix in a display area. The first substrate SUB1 comprises source lines (data bus lines) S provided in the display area and extending in a first direction, and gate lines (gate bus lines) G extending in a second direction orthogonal to the first direction. Each pixel PX comprise a memory circuit (for example, SRAM) M electrically connected to the respective gate line G and the respective source line S, a voltage supply circuit VC, a pixel electrode PE connected to the voltage supply circuit VC, and the like. The common electrode CE at a common potential is provided on the first substrate SUB1 or the second substrate SUB2 and opposes over a plurality of pixel electrodes PE.

The display panel 20 is configured as a reflective type having a reflective display function which displays images by selectively reflecting light from a display surface side such as external light or auxiliary light. For example, at least a part of each pixel electrode constitutes a reflective surface which can reflect external light. Further, in this embodiment, the display panel 20 has a transmissive display function which displays images by selectively transmitting light from a backlight device, which will be described later. At least a part of each pixel electrode constitutes a transmissive portion that can transmit light. The display panel 20 may be a touch-input display panel comprising a touch sensor (not shown). The display panel 20 is not limited to the liquid crystal display panel, but an organic EL display panel can as well be used.

In this embodiment, a cover panel 24 is attached so as to be overlaid on the display surface 20a. The display panel 20 is disposed in the housing 12 by supporting the circumferential edge portion of the cover panel 24 on the housing 12.

As shown in FIGS. 2 and 3, the backlight device 30 as a whole is formed into a polygonal shape having substantially the same size as that of the display panel 20, and disposed to oppose the rear surface of the display panel 20 (the front surface of the first substrate SUB1). The backlight device 30 comprises, for example, an annular frame (bezel) 32 formed of resin, a polygonal reflective sheet RE attached to a rear surface of the frame 32, and a plurality of optical members arranged in the frame 32 and a light source unit 36 that supplies light entering the optical members.

The optical members include a light guide LG disposed on the reflective sheet RE in the frame 32, and a plurality of optical sheets, for example, a first optical sheet OS1 and a second optical sheet OS2 disposed on the light guide LG in a stacking manner. The light guide LG is formed, for example, into a circular shape, and comprises a first main surface (emission surface) S1 opposing the display panel 20, a second main surface (reflection surface) S2 located on an opposite side to the first main surface and opposing the reflective sheet RE, and an outer circumferential surface (entering surface) EF connected to the first main surface S1 and the second main surface S2.

The light source unit 36 comprises a wiring board 36a made of a flexible printed circuit (FPC), and two light emitting elements mounted on the wiring board 36a, for example, light emitting diodes (LED) 36b. The wiring board 36a is attached to the frame 32, and the LED 36b faces the entering surface EF of the light guide LG.

The frame 32 of the backlight device 30 is attached to the rear surface of the display panel 20 with an annular double-sided tape TP1. Thus, the backlight device 30 is disposed so as to oppose the rear surface of the display panel 20.

The control circuit board 60 comprises, for example, a circular printed circuit board 60a, a plurality of electronic components 62 such as a drive IC 62a and a connector 62b mounted on one surface of the printed circuit board 60a, and a plurality of electronic components 64 including a drive IC 64a and the like mounted on the other surface of the printed circuit board 60a. The control circuit board 60 is placed on a bottom wall 12a of the housing 12 so as to oppose the display panel 20 and the backlight device 30. Here, the control circuit board 60 is placed such that the connector 62b is located on a backlight device 30 side.

Figure 4:
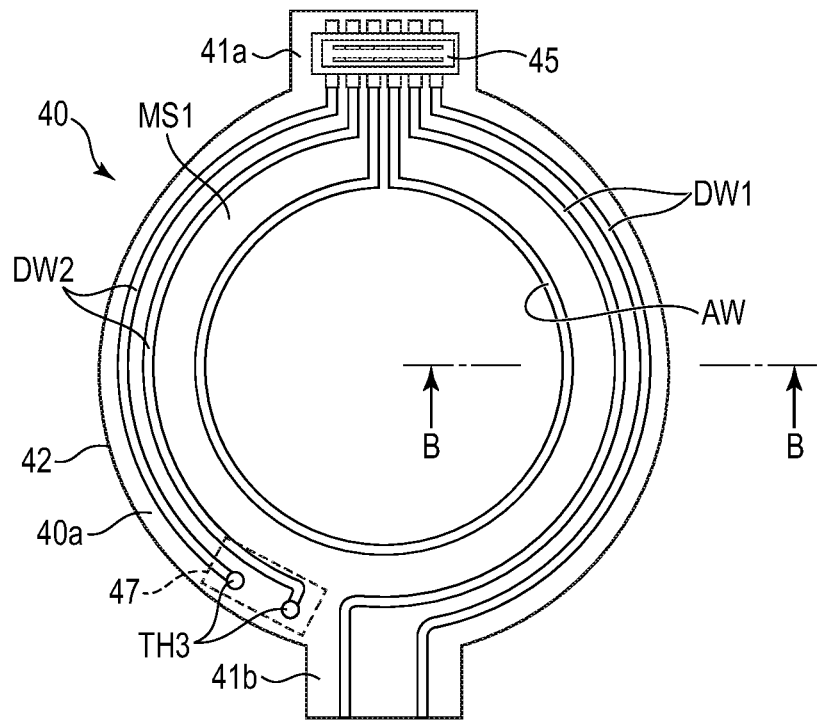
FIG. 4 is a plan view showing a wiring line side of an antenna wiring substrate (an electronic device).
Figure 5:
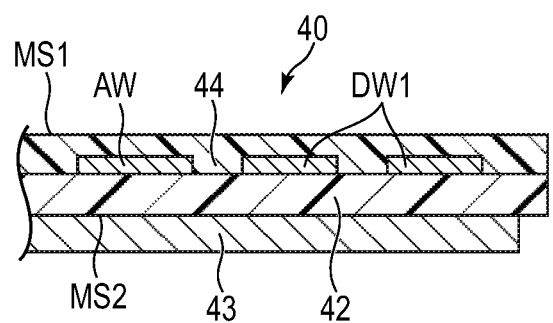
FIG. 5 is a cross-sectional view of the antenna wiring substrate taken along line B-B in FIG. 4.
Figure 6:
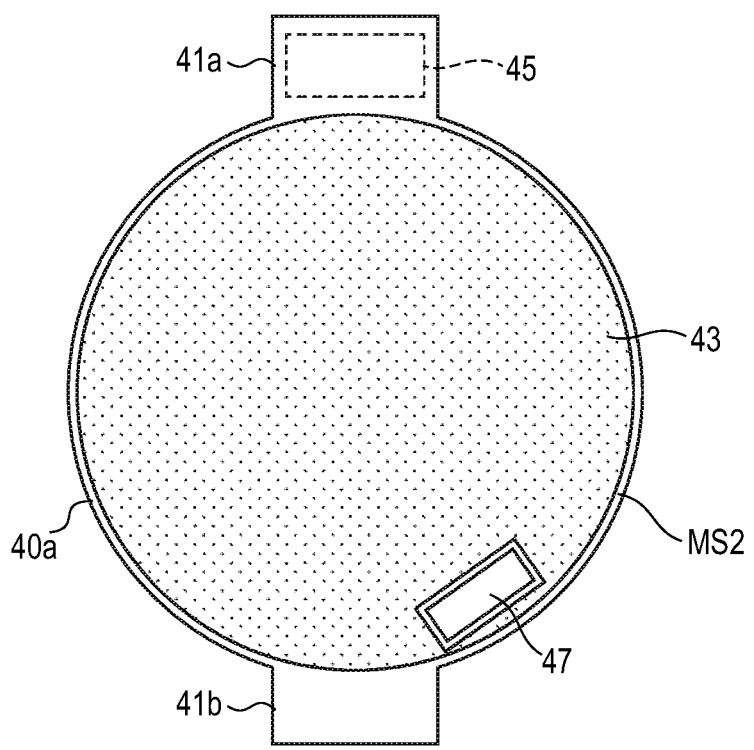
FIG. 6 is a plan view showing a rear surface side of the antenna wiring substrate.

The antenna wiring substrate 40, which is an example of the electronic device, is arranged between the backlight device 30 and the control circuit board 60 and opposes the reflective sheet RE. FIG. 4 is a plan view showing the first main surface side (wiring line side) of the antenna wiring substrate 40, FIG. 5 is a cross-sectional view of the antenna wiring substrate taken along line B-B in FIG. 4, and FIG. 6 is a plan view showing a second main surface side (rear surface side) of the antenna wiring substrate.

The antenna wiring substrate 40 is constituted by, for example, a flexible printed circuit board (FPC), and includes a circular main body 40a, a strip-shaped first extending portion 41a extending in one direction from a circumferential edge of the main body 40a and strip-shaped second extending portion 41b extending from the circumferential edge of the main body 40a in an opposite direction from that of the first extending portion, which are all integrated as one body.

As shown, the antenna wiring substrate 40, which is an example of the electronic device, comprises a base layer 42 formed of an insulating material such as polyimide, an antenna wiring line AW, signal wiring lines DW1 and second signal wiring lines DW2, formed by patterning a conductive layer such as a copper foil, formed on the base layer 42, and a protective layer 44 formed on the base layer 42 so as to be overlaid on the conductive layer. The antenna wiring substrate 40 comprises a first main surface MS1 on which wiring lines are provided and a second main surface MS2 located on an opposite side to the first main surface MS1. Further, the antenna wiring substrate 40 comprises a first connector 45 mounted on the first extending portion 41a on a first major surface MS1 side and a shield layer 43 stacked on a rear surface (the second major surface MS2) of the base layer 42. In this embodiment, the shield layer 43 is provided on the second main surface MS2 of the main body 40a and functions as a noise shield.

The antenna wiring line AW extends in a loop shape on the main body 40a, and a pair of wiring line end portions extend on the first extending portion 41a and are electrically connected to the first connector 45. The antenna wiring line AW forms a near field communication (NFC) antenna.

For example, the signal wiring lines DW1 extend from the first extending portion 41a to an extending end of the second extending portion 42b while passing over the main body 40a. On the main body 40a, the signal lines DW1 are disposed on a radially outer side and one side of the antenna wiring line AW and extend along the outer circumferential edge of the main body 40a. Respective ends of the signal wiring lines DW1 are electrically connected to the first connector 45 in the first extending portion 41a. In the first embodiment, the signal wiring lines DW1 constitute signal wiring lines for display panel, that supply drive signals and drive voltages to the display panel 20. Although only two signal wiring lines DW1 are illustrated, the number of signal wiring lines DW1 is not limited to this, but may be one or three or more. Further, the location of the signal wiring lines DW1 is not limited to one side of the antenna wiring line AW, but may be disposed on respective sides of the antenna wiring lines.

Note that although the antenna wiring line AW is a wire which forms a near field communication (NFC) antenna, the antenna wiring line AW is not limited to this, but can be applied to various antennas, such as a GPS antenna GA or a Bluetooth (registered trademark) antenna, or the like.

The second signal wiring lines DW2 extend from the first extending portion 41a to the vicinity of the second extending portion 42b passing over the main body 40a. On the main body 40a, the second signal lines DW2 are disposed on the radially outer side of the antenna wiring line AW and on an opposite side to the signal wiring lines DW1 and extend along the outer circumferential edge of the main body 40a. Respective ends of the second signal wiring lines DW2 are each electrically connected to the first connector 45. Further, the second connector 47 is mounted on the second main surface MS2 of the main body 40a in the vicinity of the second extending portion 41b. The other ends of the second signal wiring lines DW2 are electrically connected to the second connector 47 via a conductive portion formed to penetrate the base layer 42, for example, a plated through hole TH3 or a connection terminal. The second connector 47 is formed so that the wiring board 36a of the light source unit 36 described above can be connected thereto.

As shown in FIGS. 2 and 3, in the antenna wiring substrate 40 configured as described above, the antenna wiring line AW side (the first main surface MS1) opposes the backlight device 30, and the shield layer 43 side opposes the control circuit board 60. The first extending portion 41a is folded back toward the control circuit board 90 side, and the first connector 45 is electrically and mechanically joined to the connector 62b of the control circuit board 60. In this embodiment, the first connector 45 is an insertion-type connector, but this embodiment is not limited to this. Various connectors can be applied and, for example, a ZIF type connector can as well be employed.

The second extending portion 41b is joined to an end portion of the first substrate SUB1 of the display panel 20, and the signal wiring lines DW1 are electrically connected to the wiring lines of the display panel 20. The connecting end portion of the wiring board 36a of the light source unit 36 is connected to the antenna wiring substrate 40 via a second connector 47. The second connector 47 is electrically connected to the first connector 45 via signal wiring lines DW3 provided on the antenna wiring substrate 40.

As described above, the display panel 20 and the light source unit 36 are electrically connected to the control circuit board 60 via the signal wiring lines DW1 and DW2 and the first and second connectors 45 and 47 provided on the antenna wiring substrate 40.

Note that, as shown in FIG. 3, another antenna such as a GPS antenna GA or a Bluetooth antenna may be embedded in a side wall 12b of the housing 12.

According to the wearable device 10 of the first embodiment configured as described above, the antenna wiring lines and the signal wiring lines for the display panel or the light source device are provided on the antenna wiring substrate. With this structure, the display panel 20 and the light source unit 36 can be connected to the control circuit board 60 via the antenna wiring substrate. Thus, an independent wiring board (FPC) for connecting the display panel and an independent wiring board (FPC) for connecting the light source unit 36 are not required, and therefore the number of parts can be reduced, the manufacturing cost can be reduced, and the assemblability can be improved. At the same time, even when the FPC is arranged in a small housing, it is not necessary to dispose in a stacking manner, another FPC on the antenna wiring substrate 40 (in a direction orthogonal to the surface of the board), and generation of noise caused by crosstalk between the antenna wiring line AW and the FPC and adverse effects on other antennas can be significantly reduced and suppressed. Further, by reducing the number of parts, it is possible to easily install the components of the wearable device in a small housing, or it is possible to further downsize the housing. As described above, according to the first embodiment, an electronic device which can reduce noise interference between the antenna and other electronic components can be obtained.

Next, an antenna wiring substrate according to a modified example and a wearable device according to another embodiment will be described. In the modified examples and other embodiments described below, the same parts as those in the first embodiment described above are designated by the same reference numerals, and detailed description thereof will be omitted or simplified. A detailed description will be given mainly on the parts different from those of the first embodiment.

First Modified Example

Figure 7:
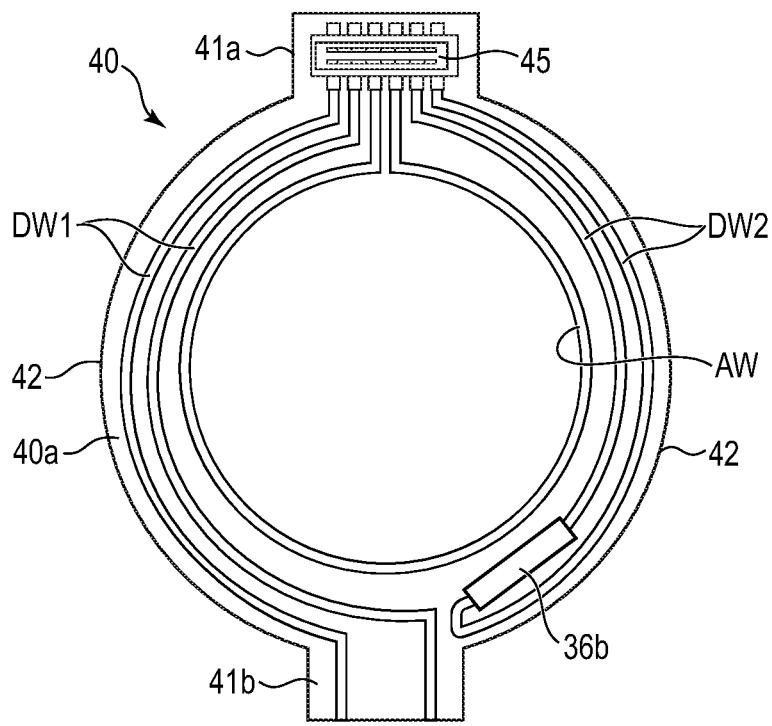
FIG. 7 is a plan view of the antenna wiring substrate according to the first modified example.

FIG. 7 is a plan view of an antenna wiring substrate according to a first modified example.

As shown in FIG. 7, in the first modified example, the light-emitting element (LED) 36b is mounted on the main body 40a of the antenna wiring substrate 40 in the vicinity of the second extending portion 41b. On the antenna wiring substrate 40, the antenna wiring line AW, the signal wiring lines DW1 for the display panel, and the second signal wiring lines DW2 for supplying drive signals to the LED 36b are provided.

The signal wiring lines DW1 extend from the first extending portion 41a to the extending end of the second extending portion 42b, passing over the main body 40a. On the main body 40a, the signal lines DW1 are disposed on the radial outer side of the antenna wiring line AW and on one side, and extend along the outer circumferential edge of the main body 40a. The signal wiring lines DW1 are electrically connected to the first connector 45 in the first extending portion 41a.

The second signal wiring lines DW2 extend from the first extending portion 41a to the LED 36b, passing over the main body 40a. On the main body 40a, the second signal lines DW2 are disposed on the radial outer side of the antenna wiring line AW and on the side opposite to the signal wiring lines DW1, and extend along the outer circumferential edge of the main body 40a. Respective ends of the second signal lines W2 are each electrically connected to the LEDs 36b. The other ends of the second signal wiring lines DW2 are electrically connected to the first connector 45 in the first extending portion 41a.

According to the first modified example, the light-emitting element 36b of the light source unit and the signal wiring lines DW2 are integrated on the antenna wiring substrate 40, and thus the independent light source unit (wiring board and light-emitting element) 36 can be omitted. Further, by omitting the independent wiring board (unshielded FPC) for the light source unit, it is possible to further reduce the adverse effects caused by noise coupling with the antenna wiring substrate 40.

Second Modified Example

Figure 8:
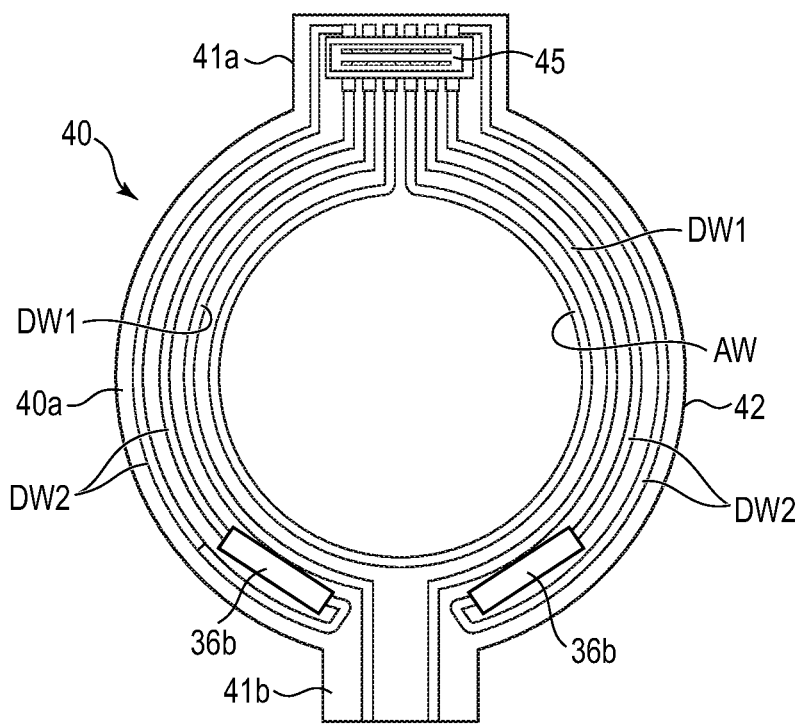
FIG. 8 is a plan view of an antenna wiring substrate according to the second modified example.

FIG. 8 is a plan view of an antenna wiring substrate according to the second modified example.

As shown in FIG. 8, in the second modified example, two light-emitting elements (LEDs) 36b are mounted on the main body 40a of the antenna wiring substrate 40 in the vicinity of the second extending portion 41b. On the antenna wiring substrate 40, the antenna wiring line AW, the signal wiring lines DW1 for the display panel, and the second signal wiring lines DW2 for supplying drive signals to the LED 36b are provided.

In the second modified example, the signal wiring lines DW1 extend from the first extending portion 41a to the extending end of the second extending portion 42b, passing over the main body 40a. On the main body 40a, the signal lines DW1 are routed on the radially outer side and respective sides of the antenna wiring line AW. The signal wiring lines DW1 are electrically connected to the first connector 45 in the first extending portion 41a.

The two second signal wiring lines DW2 extend from the first extending portion 41a to one of the LEDs 36b, passing over the main body 40a. On the main body 40a, the second signal lines DW2 are arranged on the radially outer side of the signal wiring lines DW1 and on one side and extend along the outer circumferential edge of the main body 40a. Respective ends of the second signal lines W2 are electrically connected to the LEDs 36b, respectively. The other ends of the second signal wiring lines DW2 are electrically connected to the first connector 45 in the first extending portion 41a.

The other two second signal wiring lines DW2 extend from the first extending portion 41a to the other LED 36b, passing over the main body 40a. On the main body 40a, the second signal wiring lines DW2 are arranged on the radially outer side of the signal wiring lines DW1 and on the other side, and extend along the outer circumferential edge of the main body 40a. Respective ends of the second signal lines W2 are each electrically connected to the other LED 36b. The other ends of the second signal wiring lines DW2 are electrically connected to the first connector 45 in the first extending portion 41a.

With the antenna wiring substrate according to the second modified example, it is possible to obtain advantageous effects similar to those of the antenna wiring substrate according to the first modified example described above.

Second Embodiment

Figure 9:
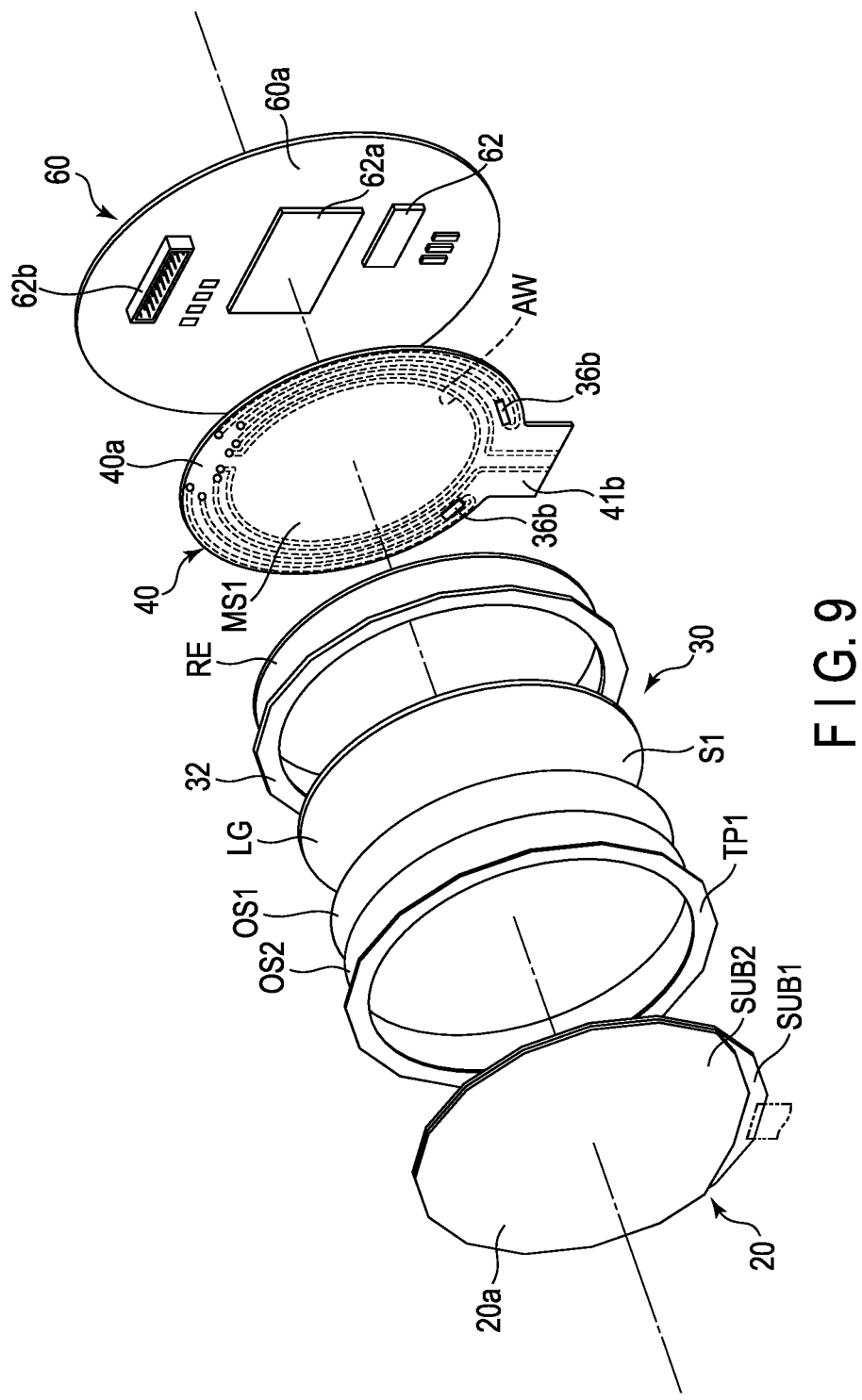
FIG. 9 is an exploded perspective view showing structural components of a wearable device according to the second embodiment.

FIG. 9 is an exploded perspective view showing structural components of a wearable device according to a second embodiment, FIG. 10 is a cross-sectional view of the wearable device according to the second embodiment, FIG. 11 is a plan view showing a wiring line side of the antenna wiring substrate, and FIG. 12 is a plan view showing a rear surface side of the antenna wiring substrate.

According to the second embodiment, as shown in FIGS. 9 and 10, the antenna wiring substrate 40 is disposed between the backlight device 30 and the control circuit board 60, and a surface on a wiring line side of the antenna wiring substrate 40 opposes the backlight device 30, and a surface on a shield layer side opposes the control circuit board 60.

As shown in FIGS. 11 and 12, the antenna wiring substrate 40 comprises a substantially circular main body 40a and a strip-shaped second extending portion 41b extending in one direction from the outer circumferential edge of the main body 40a, which are integrated as one body. The first extending portion is not provided here. Two light-emitting elements (LEDs) 36b are mounted on the main body 40a of the antenna wiring substrate 40 in the vicinity of the second extending portion 41b. On the antenna wiring substrate 40, antenna wiring lines AW, the signal wiring lines DW1 for the display panel, and the second signal wiring lines DW2 for supplying drive signals to the LED 36b are provided. The first connector 45 is mounted on the rear surface (second main surface S2) of the antenna wiring substrate 40. Further, the shield layer 43 is stacked on the entire rear surface of the main body 40a except for the first connector 45.

The antenna wiring lines AW extend in a loop shape on the main body 40a, and a pair of end portions of the antenna wiring lines AW are disposed in one end portion of the main body 40a, here, at an end portion on an opposite side to the second extending portion 41b. These end portions are electrically connected to the rear surface-side first connector 45 via conductive portions provided to penetrate the base layer 42, for example, plated through-holes TH1 or connection terminals.

The signal wiring lines DW1 each extend from the one end portion of the main body 40a to the extending end of the second extending portion 42b. On the main body 40a, the signal lines DW1 are routed on a radially outer side of the antenna wiring line AW and on respective sides. Respective ends of the signal wiring lines DW1 are electrically connected to the first connector 45 via conductive portions provided to penetrate the base layer 42, for example, plated through-holes TH2 or connection terminals.

The two second signal wiring lines DW2 extend from the one end of the main body 40a to one of the LEDs 36b on the main body 40a. On the main body 40a, the second signal lines DW2 are arranged on the radially outer side of the signal wiring lines DW1 on one side thereof and extend along the outer circumferential edge of the main body 40a. The extending ends of the second signal lines W2 are electrically connected to the LEDs 36b, respectively. Further, one end of each of the second signal wiring lines DW2 is electrically connected to the first connector 45 on the rear surface side via the plated through-hole TH3 or the connection terminal.

The other two second signal wiring lines DW2 each extend from the one end of the main body 40a to the other LED 36b, passing over the main body 40a. On the main body 40a, the second signal lines DW2 are arranged on the radially outer side of the signal wiring lines DW1 and on the other side thereof, and extend along the outer circumferential edge of the main body 40a. The extending ends of the second signal lines W2 are each electrically connected to the other LEDs 36b. The second signal wiring lines DW2 are electrically connected to the first connector 45 via plated through-holes TH3 or connection terminals.

As shown in FIG. 10, the antenna wiring substrate 40 is disposed such that a surface thereof on a wiring line side opposes the reflective sheet RE. The first connector 45 of the antenna wiring substrate 40 is fitted to the second connector 62b of the control circuit board 60. The first connector 45 and the second connector 62b are constituted by stacking connectors that can be fitted to each other, or the so-called B-to-B connectors. As a result, the antenna wiring lines AW, the signal wiring lines DW1, and the second signal wiring lines DW2 of the antenna wiring substrate 40 are electrically connected to the control circuit board 60 via the first connector 45 and the second connector 62b.

The second extending portion 41b of the antenna wiring substrate 40 is joined to the end portion of the first substrate SUB1 of the display panel 20. Thus, the signal wiring lines DW1 are electrically connected to the wiring lines of the first substrate SUB1. Further, the LEDs 36b mounted on the antenna wiring substrate 40 are located to be adjacent to and opposing each other on the entering surface EF of the light guide LG.

According to the second embodiment configured as described above, the signal wiring lines WD1 for the display panel and the second signal wiring lines WD2 for driving the LEDs are provided on the antenna wiring substrate 40, and thus the display panel 20 and the LEDs 36b can be connected to the control circuit board 60 via the antenna wiring substrate. Thus, the independent wiring board (FPC) for connecting the display panel and the independent wiring board (FPC) for connecting the light source unit 36 are not required, and therefore the number of parts can be reduced, the manufacturing cost can be reduced, and the assemblability can be improved. At the same time, even when the FPC is arranged in a small housing, it is not necessary to stack another FPC on the antenna wiring substrate 40 (stacking in a direction orthogonal to the board surface), and generation of noise caused by crosstalk between the antenna wiring lines AW and the FPC and adverse effects on other antennas can be significantly reduced and suppressed.

Further, with the light-emitting elements (LEDs) 36b mounted on the antenna wiring substrate 40, the independent light source device (the wiring board and light-emitting elements) is not required, and the number of parts and the size of the device can be reduced. Further, in this embodiment, the stacking connector provided on the rear surface of the main body 40a is used as the first connector of the antenna wiring substrate 40, and thus the first extending portion 41a of the antenna wiring substrate 40 can be omitted, thereby making it possible to reduce the size of the antenna wiring substrate 40. At the same time, the antenna wiring substrate 40 and the control circuit board 60 can be easily connected.

As described above, according to the second embodiment, an electronic device which can reduce noise interference between the antenna and other electronic components can be obtained.

Third Modified Example

FIG. 13 is a plan view showing a wiring line side of the antenna wiring substrate according to a third modified example, and FIG. 14 is a plan view showing a rear surface side of the antenna wiring substrate.

As shown in FIGS. 13 and 14, in the third modified example, two light emitting elements (LEDs) 36b are mounted on the main body 40a of the antenna wiring substrate 40 in the vicinity of the second extending portion 41b. Second signal wiring lines DW2 for supplying drive signals to the LEDs 36b are provided on the antenna wiring substrate 40. The two second signal wiring lines DW2 each extends from one end of the main body 40a to one of the LEDs 36b, passing over the main body 40a, and electrically connected to the LED 36b. Respective ends of the second signal wiring lines DW2 are electrically connected to the rear-side first connector 45 via plated through-holes TH3 or connection terminals, respectively. In this modified example, the other ends of the second signal wiring lines DW2 extend from the LED 36b and are exposed from the rear surface of the antenna wiring substrate 40 through plated through-holes TH4 or connection terminals. Further, they extend to the first connector 45 via the rear surface side (connector mounting surface) of the antenna wiring substrate 40 and are electrically connected to the first connector 45, which makes it possible to expand the installation area of the antenna wiring line AW.

The other configurations of the antenna wiring substrate are the same as those of the antenna wiring substrate in the second embodiment described above.

Third Embodiment

FIG. 15 is an exploded perspective view showing structural components of a wearable device according to the third embodiment, and FIG. 16 is a cross-sectional view of the wearable device according to the third embodiment.

According to the third embodiment, as shown in FIGS. 15 and 16, the antenna wiring substrate 40 is disposed between the backlight device 30 and the control circuit board 60, and the surface on the wiring line side of the antenna wiring substrate 40 opposes the backlight device 30, and the surface on the shield layer side opposes the control circuit board 60. The antenna wiring substrate 40 comprises a white cover layer RE formed on the entire surface of the main body 40a except for the LEDs 36b. The white cover layer RE functions as a reflective sheet of the backlight device 30. That is, the white cover layer RE is located to be adjacent to and oppose the rear surface S2 of the light guide LG, and reflects light emitted from the light guide LG toward the light guide LG. The reflective sheet of the backlight device 30 is omitted, and the reflective sheet is integrated within the antenna wiring substrate 40.

The other configurations of the wearable device 10 are similar to those of the wearable device according to the second embodiment described above.

According to the third embodiment, the antenna wiring substrate 40 is made to have the function of the reflective sheet, and thus various functions can be integrated in the antenna wiring substrate 40, and the number of structural parts of the wearable device can be reduced. Moreover, in the third embodiment as well, it is possible to obtain advantageous effects similar to those of the first and second embodiments described above.

Fourth Embodiment

FIG. 17 is a plan view showing an antenna wiring substrate of a wearable device according to the fourth embodiment, and FIG. 18 is a cross-sectional view of the antenna wiring substrate taken along line C-C in FIG. 17.

According to the fourth embodiment, as shown in FIGS. 17 and 18, the antenna wiring substrate 40 comprises a second shield layer 43b provided on the surface on the wiring line side of the main body 40a, in addition to the shield layer 43 formed on the rear surface of the main body 40a. The second shield layer 43b is formed into an annular shape and has an outer diameter substantially equal to that of the main body 40a and an inner diameter slightly larger than the diameter of the antenna wiring line AW. The second shield layer 43b covers the signal wiring lines DW1 except for the antenna wiring line AW and the LEDs 36b.

In the fourth embodiment, the other configurations of the antenna wiring substrate 40 and the wearable device are similar to those of the antenna wiring substrate according to the second embodiment described above.

According to the fourth embodiment, with the second shield layer 43b provided on the antenna wiring substrate 40, the generation of noise caused by crosstalk between the signal wiring lines DW1 and other electronic components and adverse effects on other antennas can be further reduced and suppressed. In addition, in the fourth embodiment as well, it is possible to obtain advantageous effects similar to those of the above-described first and second embodiments.

While certain embodiments and modified examples have been described, these embodiments and modified examples have been presented by way of example only, and are not intended to limit the scope of the inventions. Indeed, the novel embodiments and modified examples described herein may be embodied in a variety of other forms; furthermore, various omissions, substitutions and changes in the form of the embodiments and modified examples described herein may be made without departing from the spirit of the inventions. The accompanying claims and their equivalents are intended to cover such forms or modifications as would fall within the scope and spirit of the inventions. It is understood that other operational effects brought about by the above-described embodiments or modified examples, which are apparent from the description of the present specification, or those which can be appropriately conceived by those skilled in the art, are brought about by the present invention.

All configurations that can be appropriately modified and implemented by those skilled in the art based on the configurations described above as the embodiments of the present invention are also within the scope of the present invention as long as they include the gist of the present invention. For example, the antenna wiring substrate is not limited to a circular shape, but can have any shape according to the shape of the housing or the installation place. The number of signal wiring lines is not limited to the embodiment and can be increased or decreased as necessary. Further, the number of light sources installed is not limited to one or two, and may be increased as necessary. The wearable device is not limited to the wristwatch type, and can be applied to various other wearable devices. Further, the display panel is not limited to the liquid crystal display panel with a built-in memory, but other liquid crystal display panel or organic EL display panel or the like may be used.

What is claimed is:

1. An electronic device comprising:
a display panel;
an antenna wiring substrate opposed to the display panel and comprising an antenna wiring line forming an antenna; and
a signal wiring line provided on the antenna wiring substrate and supplying a drive signal to the display panel, wherein
the antenna wiring substrate comprises a main body and a strip-shaped extending portion extending from one side of the main body, integrated as one body,
the antenna wiring line extends in a loop shape on the main body, and
the signal wiring line extends from one end portion of the main body to an extending end of the strip-shaped extending portion, passing on an outer side the loop of the antenna wiring line.

2. The electronic device of claim 1, wherein
the antenna wiring substrate comprises a first main surface on which the antenna wiring line and the signal wiring line are provided, and a second main surface located on an opposite side to the first main surface, and
which further comprises a shield layer stacked on the second main surface of the main body.

3. The electronic device of claim 2, further comprising:
a second shield layer stacked on the first main surface of the main body,
wherein
the second shield layer is provided on an outer side of the loop shape of the antenna wiring line to cover the signal wiring line.

4. The electronic device of claim 2, further comprising:
a first connector mounted on the first main surface of the antenna wiring substrate,
wherein
a pair of end portions of the antenna wiring line and one end portion of the signal wiring line are electrically connected to the first connector.

5. The electronic device of claim 4, further comprising:
a light-emitting element mounted on the main body; and
a second signal wiring line provided on the main body,
wherein
the second signal wiring line comprises one end electrically connected to the light emitting element, and an other end electrically connected to the first connector.

6. The electronic device of claim 1, further comprising:
a light-emitting element mounted on the antenna wiring substrate; and
a second signal wiring line provided on the antenna wiring substrate and electrically connected to the light-emitting element.

7. The electronic device of claim 2, further comprising:
a first connector mounted on the second main surface of the antenna wiring substrate,
wherein
a pair of end portions of the antenna wiring line and one end portion of the signal wiring line are electrically connected to the first connector via a conductive portion formed to penetrate the antenna wiring substrate.

8. An electronic device comprising:
a display panel;
an antenna wiring substrate opposed to the display panel and comprising an antenna wiring line forming an antenna;
a signal wiring line provided on the antenna wiring substrate and supplying a drive signal to the display panel;
a light-emitting element mounted on the antenna wiring substrate; and
a second signal wiring line provided on the antenna wiring substrate and electrically connected to the light-emitting element.

* * * * *